(12) United States Patent
Bender et al.

(10) Patent No.: US 6,721,190 B1
(45) Date of Patent: Apr. 13, 2004

(54) BOARD ALIGNMENT TAB

(75) Inventors: Shawn E. Bender, Mountain View, CA (US); William J. Lewis, Mountain View, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 10/044,265

(22) Filed: Jan. 10, 2002

(51) Int. Cl.$^7$ ................................................ H05K 7/14
(52) U.S. Cl. ...................... 361/802; 361/752; 361/756; 361/801; 211/41.17
(58) Field of Search ................................ 361/728–730, 361/740, 752, 753–759, 801, 802; 211/41.17; 269/903

(56) References Cited

U.S. PATENT DOCUMENTS

| | | | | |
|---|---|---|---|---|
| 3,878,438 A | * | 4/1975 | Weisman | 361/802 |
| 4,508,228 A | * | 4/1985 | Erlam | 211/41.17 |
| 5,927,389 A | * | 7/1999 | Gonsalves et al. | 165/121 |
| 6,381,147 B1 | * | 4/2002 | Hayward et al. | 361/756 |

* cited by examiner

Primary Examiner—Jayprakash N. Gandhi
(74) Attorney, Agent, or Firm—Campbell Stephenson Ascolese LLP

(57) ABSTRACT

A card based telecommunications system, which includes a chassis. A plurality of card guides positioned in an operable relationship within said chassis. A tab member proximate to each of the card guides to occupy a substantial portion of a first space to prevent a first card from entering the first space and contacting a second card.

23 Claims, 5 Drawing Sheets

BOARD ALIGNMENT TAB

BACKGROUND

1. Field of Invention

This invention relates to telecommunications equipment systems, and specifically to an apparatus for providing proper alignment during board insertion in a card based telecommunications equipment assembly.

2. Relevant Art

Most modern telecommunications equipment contains electronic apparatuses mounted in a chassis. The chassis generally includes, a front access, side walls, and a backplane. The chassis can be enclosed to prevent stray material from entering the chassis and damaging the electronic apparatuses, to prevent stray emission of electromagnetic energy and to enhance airflow.

Most chassis are formed with a series of card guides, which help direct a board into the chassis, such that connectors resident on the board are properly aligned with the appropriate corresponding connectors resident on the backplane.

Various features have been implemented on boards and card guides, which help to ensure that boards are not inserted into the wrong card guide. Unfortunately, there are currently no known features, which prevent boards that are misaligned while being initially inserted into the card guide from contacting adjacently positioned boards. Problems in the field resulting from this inadequacy of design can range from stripping off of components from the boards to causing shorts from one board to the next.

What is needed is an apparatus that directs board installers to insert the boards in the correct manner to avoid damaging adjacent boards during installation.

SUMMARY

The present invention provides an apparatus for addressing misalignment during board installation. In accordance with the present invention, the apparatus can include a tab that is formed and positioned on the side face of the card guide. The apparatus deters an installer from inserting boards in a card guide in a manner which causes the board to be misaligned.

In one aspect of the invention an apparatus is provided to facilitate card alignment. The apparatus can include a chassis configured to removably receive the card and a card guide positioned within the chassis which defines a first space. The apparatus also includes a tab positioned in the first space configured to prevent the card from entering the first space.

In another aspect of the invention, a card based telecommunications system is provided, which includes a chassis having a top wall and a bottom wall configured to receive a plurality of cards, where each card includes a faceplate. A plurality of card guides are positioned on the bottom wall in a corresponding and operable relationship to a plurality of card guides positioned on the top wall. Each of the plurality of card guides has a front face and a side face. A distance between the side face and the faceplate define a first space. A tab member proximate to each of the side faces of each of the card guides, where a major surface of the tab member is made flush with the front face of the card guide. The tab member occupies a substantial portion of the first space.

In another aspect of the present invention, an apparatus is provided to facilitate card alignment. The apparatus can include a chassis and a card guide positioned within the chassis to define a first space. The apparatus also includes means for preventing a first card from entering the first space and contacting a second card.

The apparatus of the present invention provides many advantages. For example, although boards are typically installed by experienced professionals, the apparatus can help to ensure that these installers or less experienced installers do not harm the boards during installation. Damage to boards during installation generally account for losses to companies on the order of thousands of dollars. The apparatus of the present invention can help to minimize these loses and save thousands of dollars.

These and other objects, features and advantages of the present invention will be more readily apparent from the detailed description of the preferred embodiments set forth below taken in conjunction with the accompanying drawings.

DETAILED DESCRIPTION

Figure 1:
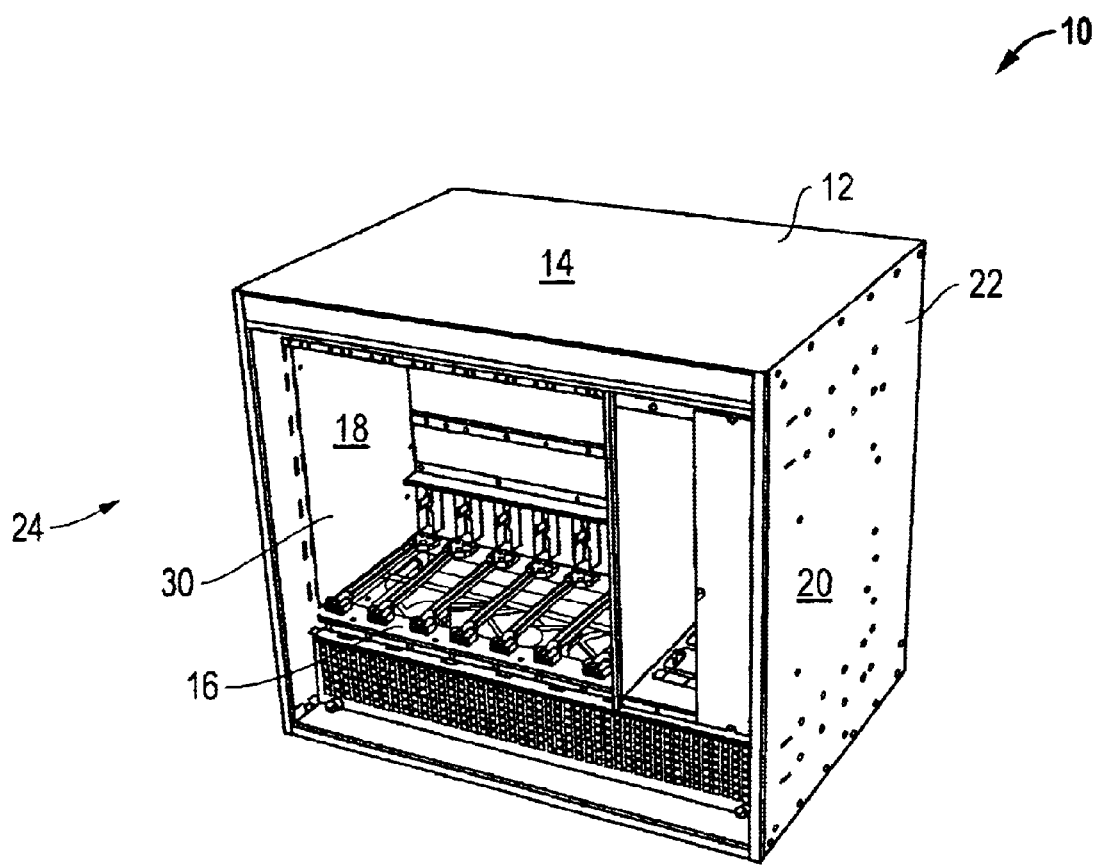
FIG. 1 is a simplified perspective view of a shelf assembly in accordance with the present invention.

FIG. 1 illustrates a telecommunications equipment assembly 10 (hereinafter "shelf assembly 10" or "shelf 10") configured in accordance with an embodiment of the present invention. In this embodiment, shelf assembly 10 can include a housing or chassis 12, which includes several components, such as top wall 14, a bottom wall 16, a side wall 18, a side wall 20, and a back wall 22, which collectively define an internal cavity 30. Generally, housing 12 may be made with sheet metal, injection molded plastic, or other similarly suited structural materials.

Interior cavity 30 is suitable for removably receiving one or more electronic apparatuses. In one embodiment, interior cavity 30 is large enough to be capable of removably receiving electronic apparatuses. The electronic apparatuses can include, but not limited to, cPCI boards, such as those used in the Cisco Integrated Communications System (ICS) 7750 and other types of plug-in boards, which may provide a telecommunications functionality, such as IP telephony, Voice applications, multi-service routing and the like to shelf assembly 10.

An access opening 24 provides access to interior cavity 30 for replacement, removal, assembly, servicing, and/or repair of the electronic apparatuses. As discussed in detail below, top and bottom walls 14 and 16, respectively, can include guides having slots or grooves used to support, guide, and align the plug-in cards while housed in interior cavity 30.

Back wall 22 can include a backplane, which is a printed circuit board that extends substantially the width of housing 12. The backplane includes circuitry identical to circuitry in a conventional backplane well-known in the telecommunications industry, which provides electrical characteristics, such as shielding, conductor path characteristics, including controlled impedance, current carrying capacity, paths for instrument buses, data busses, unit under test (UUT) stimulus busses, and power busses. In one embodiment, the backplane provides the electrical interface between the electronic apparatus enclosed in housing 12 and external cables.

Figure 2A:
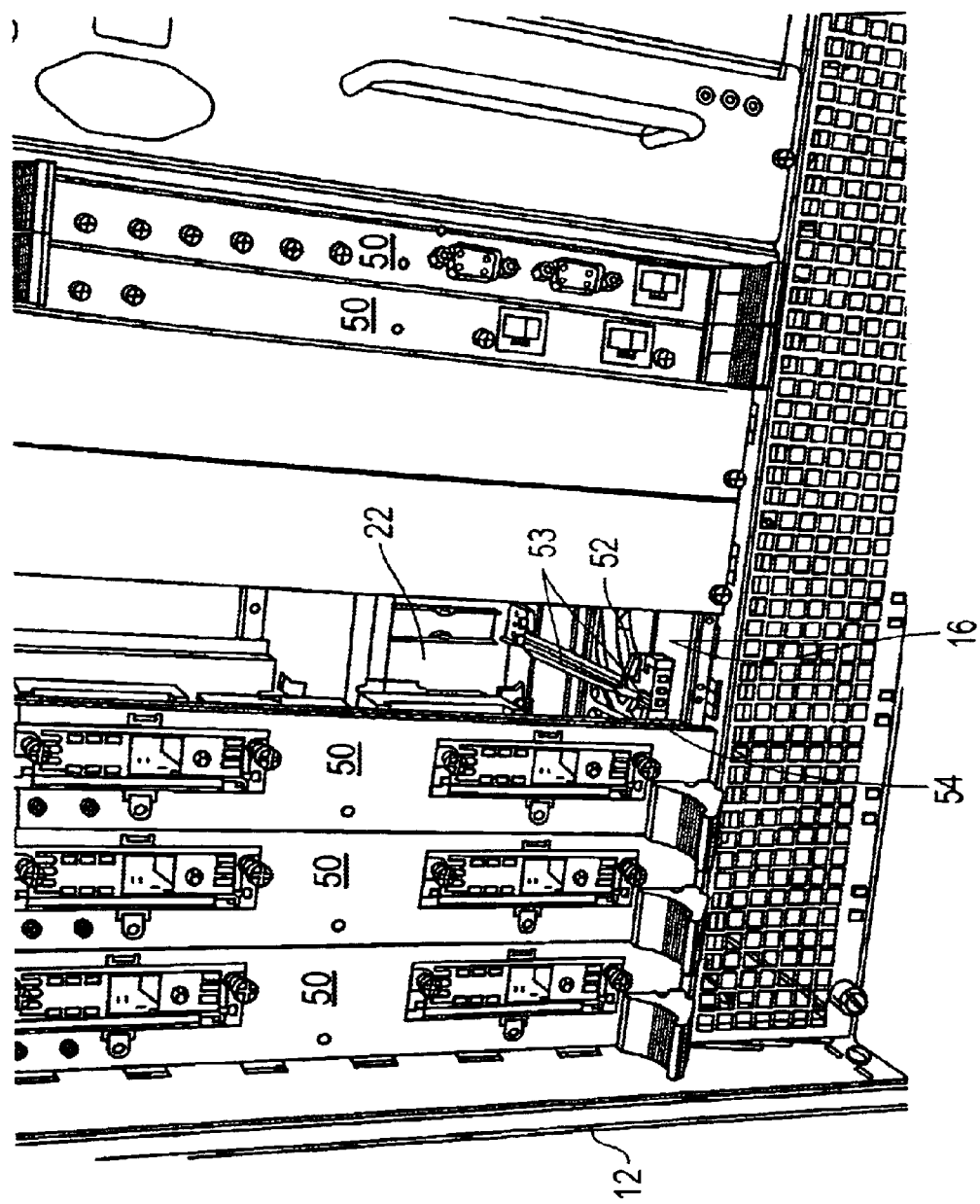
FIG. 2A is a simplified front perspective view of shelf assembly including a plurality of electronic apparatuses and card guides in accordance with an embodiment of the present invention.

FIG. 2A is a simplified front perspective view of shelf assembly 10 including a plurality of electronic apparatuses 50, such as a cPCI boards (hereinafter "board(s) 50"), in accordance with an embodiment of the present invention. Shelf assembly 10 also includes a plurality of card guides 52, with card slots 53, placed parallel to one another and positioned substantially on both top wall 14 and bottom wall 16 of chassis 12. Card guides 52 extend inside internal cavity 30 substantially the depth of housing 12, such that boards 50 placed into slots 53 of card guides 52 allow connector components on board 50 to be readily plugged into connectors resident on backplane 22. Card guides 52 may be made of any suitable material, for example, plastic.

Figure 2C:
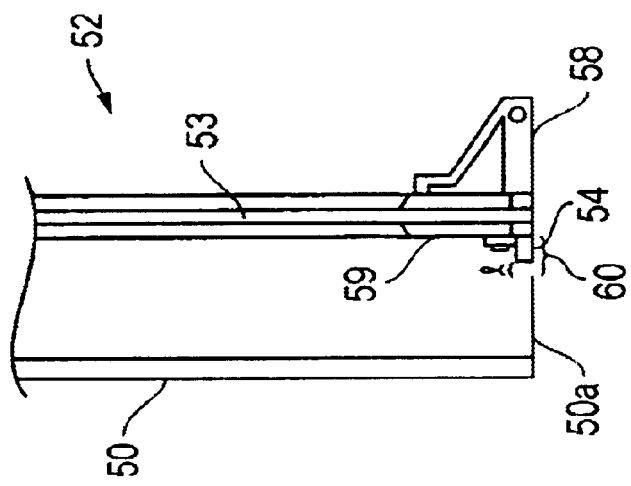
FIG. 2C is a simplified top view of a card guide including a tab in accordance with an embodiment of the present invention.
Figure 2B:
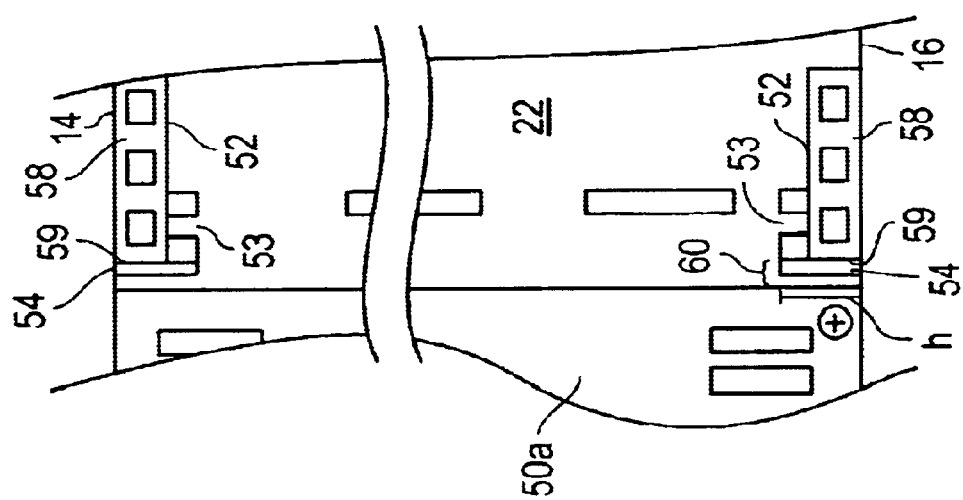
FIG. 2B is a simplified partial front view of a portion of shelf assembly including a view of tabs, card guides, and a faceplate in accordance with an embodiment of the present invention.

FIG. 2B is a simplified partial front view of a portion of shelf assembly 10 including a view of tabs 54, card guides 52, positioned on top wall 14 and bottom wall 16 of chassis 12, and a faceplate 50a in accordance with an embodiment of the present invention. FIG. 2C is a simplified top view of card guide 52 including tab 54. As best understood from FIGS. 2B and 2C, tabs 54 are positioned in space 60 defined between side face 59 of card guide 52 and faceplate 50a and between bottom wall 16 (or top wall 14) and the height h of card guide 52 to preclude a neighboring board from entering space 60 and contacting board 50.

Figure 3A:
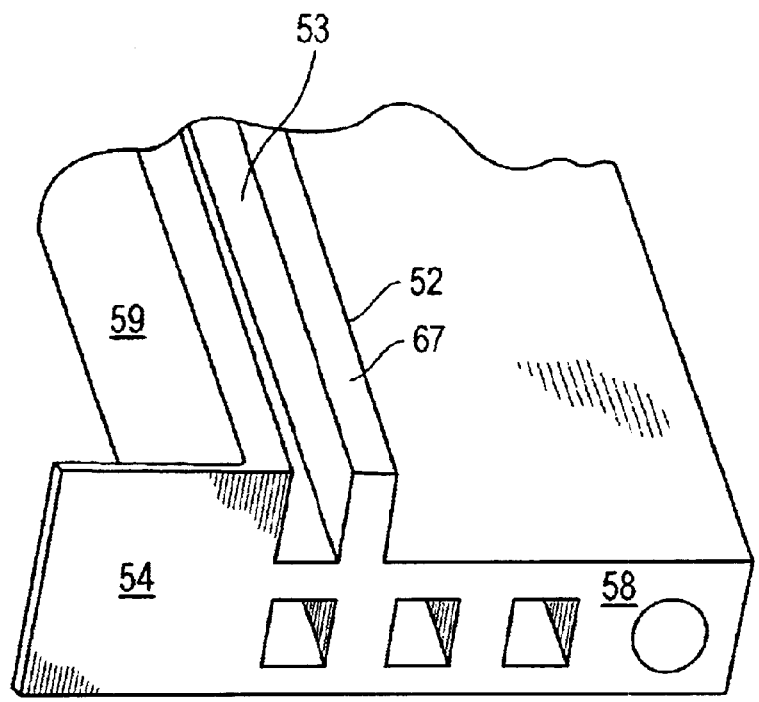
FIG. 3A is a simplified perspective view of the tab and a portion of the card guide in accordance with an embodiment of the present invention.
Figure 3A:
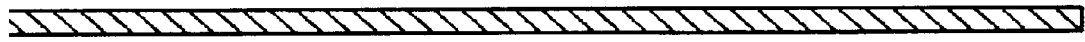

Tabs 54 can be made of any structurally suitable material, such as plastic or sheet metal. Tabs 54 can be molded or punched and formed using well known plastic and sheet metal forming techniques. In one embodiment, Tabs 54 can be mounted to side face 59 of card guide 52 using various mounting techniques, for example, gluing, soldering, and mechanical fastening, such as using a sheet metal screw, a rivet or similar techniques. Tab 54 can be mounted to side face 59, such that tab 54 is flush with front face 58 of card guides 52. In another alternative embodiment, tabs 54 may be formed during the manufacturing of card guides 52 as an integral part of the card guides (FIG. 3A).

Figure 3B:
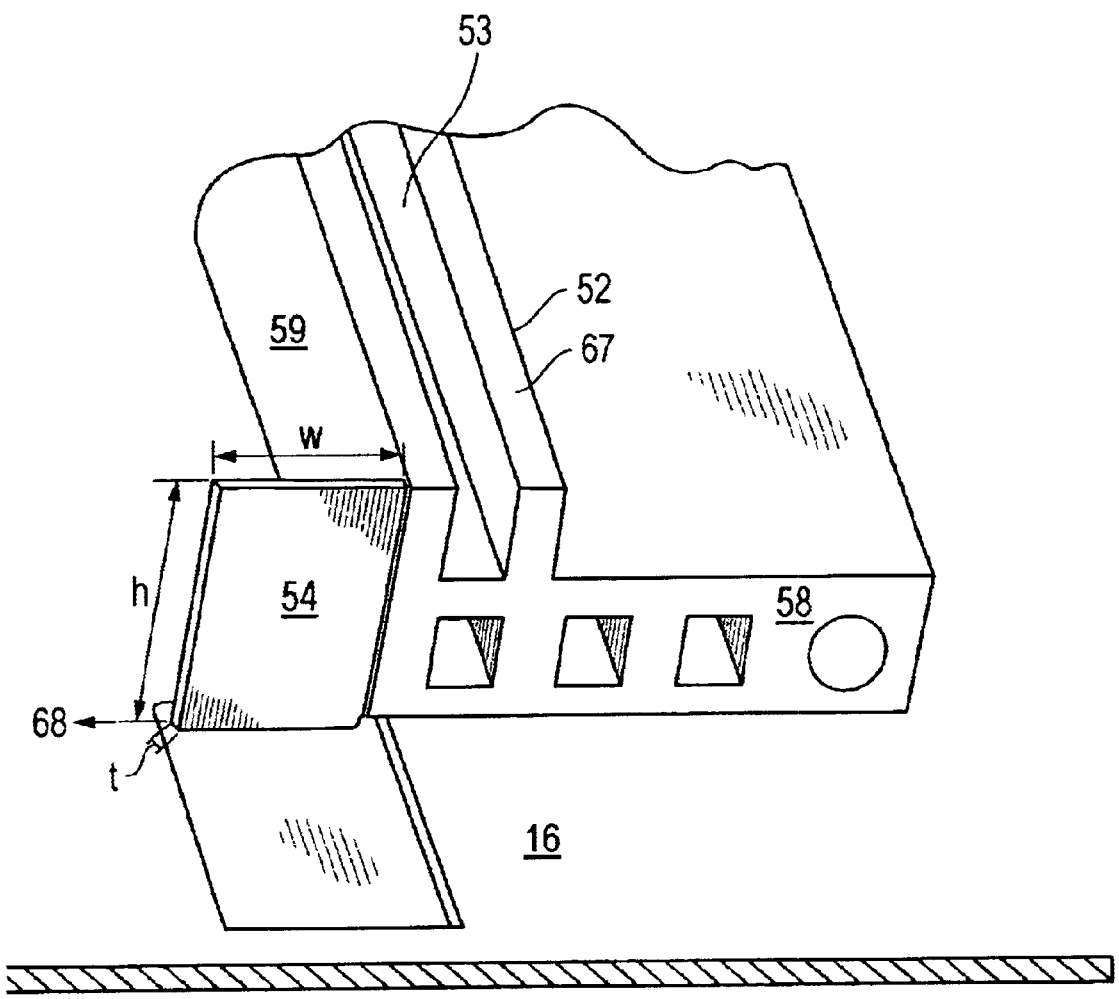
FIG. 3B is a simplified and perspective view of the tab and a portion of the card guide in accordance with an embodiment of the present invention.

FIG. 3B is a simplified and magnified perspective view of tab 54 and a portion of card guide 52 in accordance with an embodiment of the present invention. In this embodiment, tabs 54 can be formed and punched from bottom wall 16 (or top wall 14) and bent about axis 68 to a position flush with front face 58 of card guide 52. As shown in FIG. 3B, in most embodiments, the height h of tabs 54 should be no greater than the corresponding height of top surface 67 of card guide 52 (i.e., the maximum height of card guides 52), to ensure that tabs 54 remain within the "no component zone" or "keep-out" zone on board 50. For example, tabs 54 can range in height h up to about 0.3 inches. Tabs 54 can be any suitable width w that ensures that space 60 (FIG. 2B) is substantially blocked to preclude entry of board 50. For example, width w of tabs 54 should be wide enough so that distance 1 (FIG. 2C) between tab 54 and faceplate 50a, or any portion of board 50, is no greater than 0.06 inches. In one embodiment, width w is at least twice the material thickness t of tabs 54.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. An apparatus to facilitate card alignment comprising:
   a card guide including a card slot configured to removably receive a card; and
   a tab adjacent to said card guide and positioned within a first space defined by a first outer wall of said card slot and an adjacent card, such that said tab precludes said card from entering said first space.

2. The apparatus of claim 1, wherein said card comprises a telecommunications functionality.

3. The apparatus of claim 1, wherein said card comprises a cPCI board.

4. The apparatus of claim 1, wherein said first space is defined as a first distance between a faceplate of said adjacent card and a side face of said card guide.

5. The apparatus of claim 1, wherein said tab has a height no greater than a height of said card guide.

6. The apparatus of claim 1, wherein said tab is formed as a portion of said card guide.

7. The apparatus of claim 1, wherein said tab is mounted to said card guide.

8. The apparatus of claim 1, further comprising:
   a chassis including said card guide, wherein said tab is punched from a portion of said chassis and formed into said first space.

9. The apparatus of claim 1, wherein said tab is a rectangular member having a height of no greater than 0.3 inches and a width of no greater than 0.06 inches less than the width of said first space.

10. The apparatus of claim 1, wherein said card guide comprises a first portion extending from said card guide in a direction opposite said tab.

11. A card based telecommunications system comprising:
    a chassis having a top wall and a bottom wall configured to receive a plurality of cards;
    a plurality of card guides positioned on said bottom wall in a corresponding and operable relationship to a plurality of card guides positioned on said top wall, each of said plurality of card guides having a front face and a side face, a distance between each said side face and a portion of each of said plurality of cards defining a first space; and
    a tab member proximate to each of said side faces of each of said card guides, a major surface of said tab member flush with said front face of said card guide, wherein each of said tab members is positioned within one of said first spaces, such that said tab member precludes entry of a card of said plurality of cards into said one of said first spaces.

12. The apparatus of claim 11, wherein said card comprises a telecommunications functionality.

13. The apparatus of claim 11, wherein said card comprises a cPCI board.

14. The apparatus of claim 11, wherein said tab member comprises a height no greater than a height of each of said plurality of card guides.

15. The apparatus of claim 11, wherein said tab member is formed as a portion of each of said plurality of card guides.

16. The apparatus of claim 11, wherein said tab member is mounted to each of said plurality of card guides.

17. The apparatus of claim 11, wherein said tab member is punched from a portion of said chassis and formed into said first space.

18. The apparatus of claim 11, wherein said tab is a rectangular member having a height of no greater than 0.3 inches and a width of no greater than 0.06 inches less than the width of said first space.

19. An apparatus to facilitate card alignment comprising:

a card guide including a card slot configured to removably receive a card; and means for precluding entry of said card into a first space defined by a first outer wall of said card slot and an adjacent card, wherein
said means for precluding is Positioned within said first space.

20. The apparatus of claim 19, wherein said means comprises a height no greater than a height of each of said plurality of card guides.

21. The apparatus of claim 19, wherein said means is punched from a portion of said chassis and formed into said first space.

22. The apparatus of claim 19, wherein said card guide comprises a first portion extending from said card guide in a direction opposite said means for precluding entry.

23. The apparatus of claim 19, further comprising:

a chassis including said card guide and said means for precluding entry.

* * * * *